United States Patent
Habuka et al.

[19]

[11] Patent Number: 6,048,793
[45] Date of Patent: Apr. 11, 2000

[54] METHOD AND APPARATUS FOR THIN FILM GROWTH

[75] Inventors: Hitoshi Habuka; Masanori Mayuzumi, both of Gunma-ken, Japan; Naoto Tate, Camas, Wash.; Masatake Katayama, Gunma-ken, Japan

[73] Assignee: Shin-Etsu Handotai Co., Ltd., Tokyo, Japan

[21] Appl. No.: 08/546,868

[22] Filed: Oct. 23, 1995

[30] Foreign Application Priority Data

Oct. 25, 1994 [JP] Japan .................................. 6-284233

[51] Int. Cl.$^7$ .................................................. C23C 16/01
[52] U.S. Cl. .......................... 438/660; 438/694; 438/799; 427/534; 427/248.1; 427/309; 427/314; 134/22.1
[58] Field of Search ................................ 427/534, 248.1, 427/255, 309, 314; 438/660, 694, 799; 134/22.1

[56] References Cited

U.S. PATENT DOCUMENTS

| | | | |
|---|---|---|---|
| 4,263,336 | 4/1981 | Thompson et al. | 427/51 |
| 4,728,389 | 3/1988 | Logar | 156/612 |
| 5,097,890 | 3/1992 | Nakao | 165/39 |
| 5,356,830 | 10/1994 | Yoshikawa et al. | 437/89 |
| 5,444,217 | 8/1995 | Moore et al. | 219/405 |
| 5,491,112 | 2/1996 | Buchta et al. | 437/225 |

FOREIGN PATENT DOCUMENTS 0 296 804 A2   6/1988   European Pat. Off. .

*Primary Examiner*—Timothy Meeks
*Attorney, Agent, or Firm*—Snider & Associates; Ronald R. Snider

[57] ABSTRACT

In a method and an appratus for a thin film growth on a semiconductor crystal substrate, impurities and contaminants absorbed on the inside wall of the reaction vessel are very harmful because these impurities and contaminants will deteriorate the quality of the thin film. A method and an apparatus by which the quantity of these impurities and contaminants absorbed on the inside wall of the reaction vessel can be restrained and removed easily are disclosed in this invention, wherein a semiconductor crystal substrate is mounted in the reaction vessel, and the wall of the reation vessel is cooled forcibly by a coolant while the substrate is under heating procedure to grow a thin film on the substrate by supplying the raw material gas into the reaction vessel. And the temperature of the wall of the reaction vessel during the procedure except the thin film growth is kept higher temperature than the temprature of the wall of the reaction vessel during the thin film growth procedure.

18 Claims, 6 Drawing Sheets

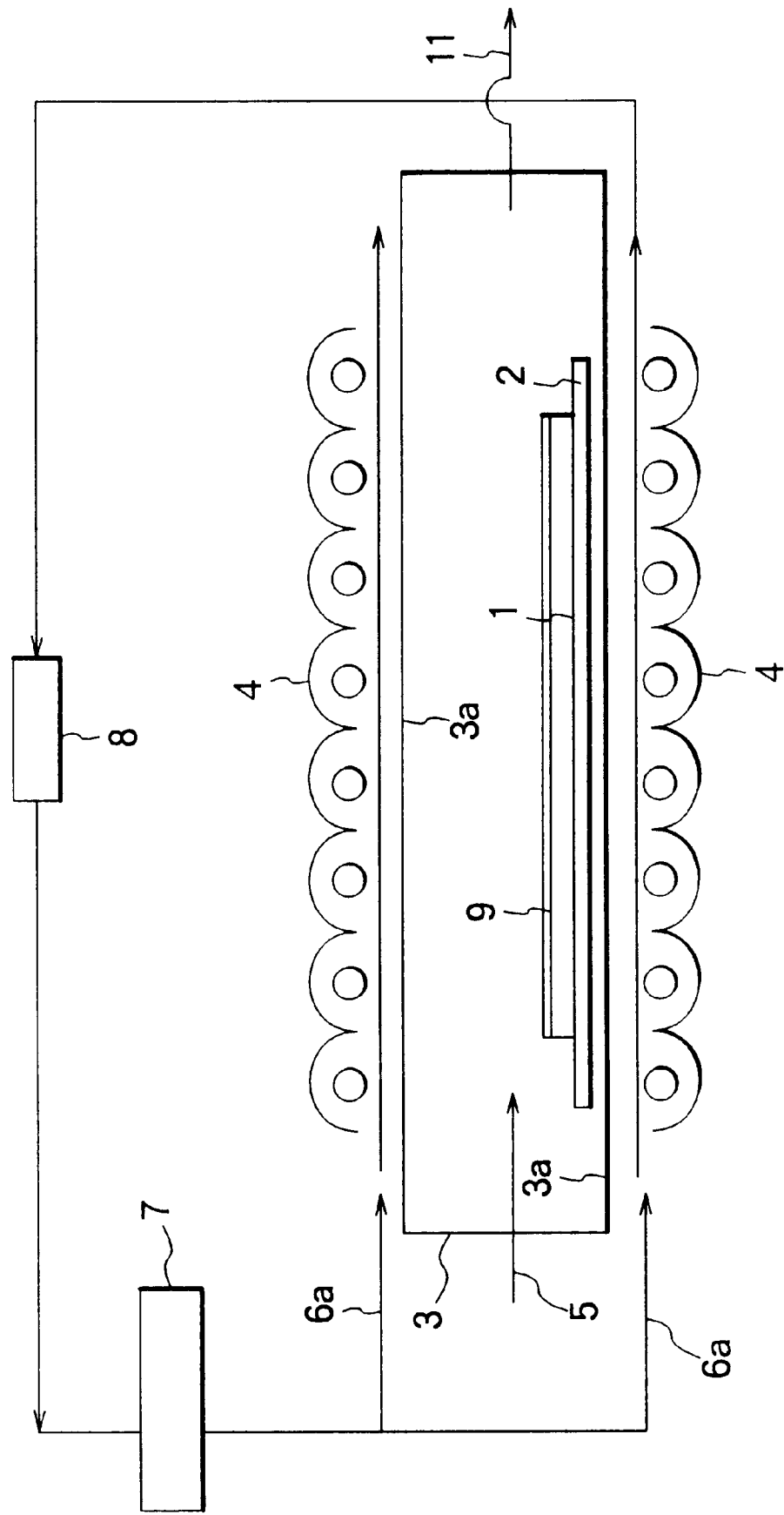

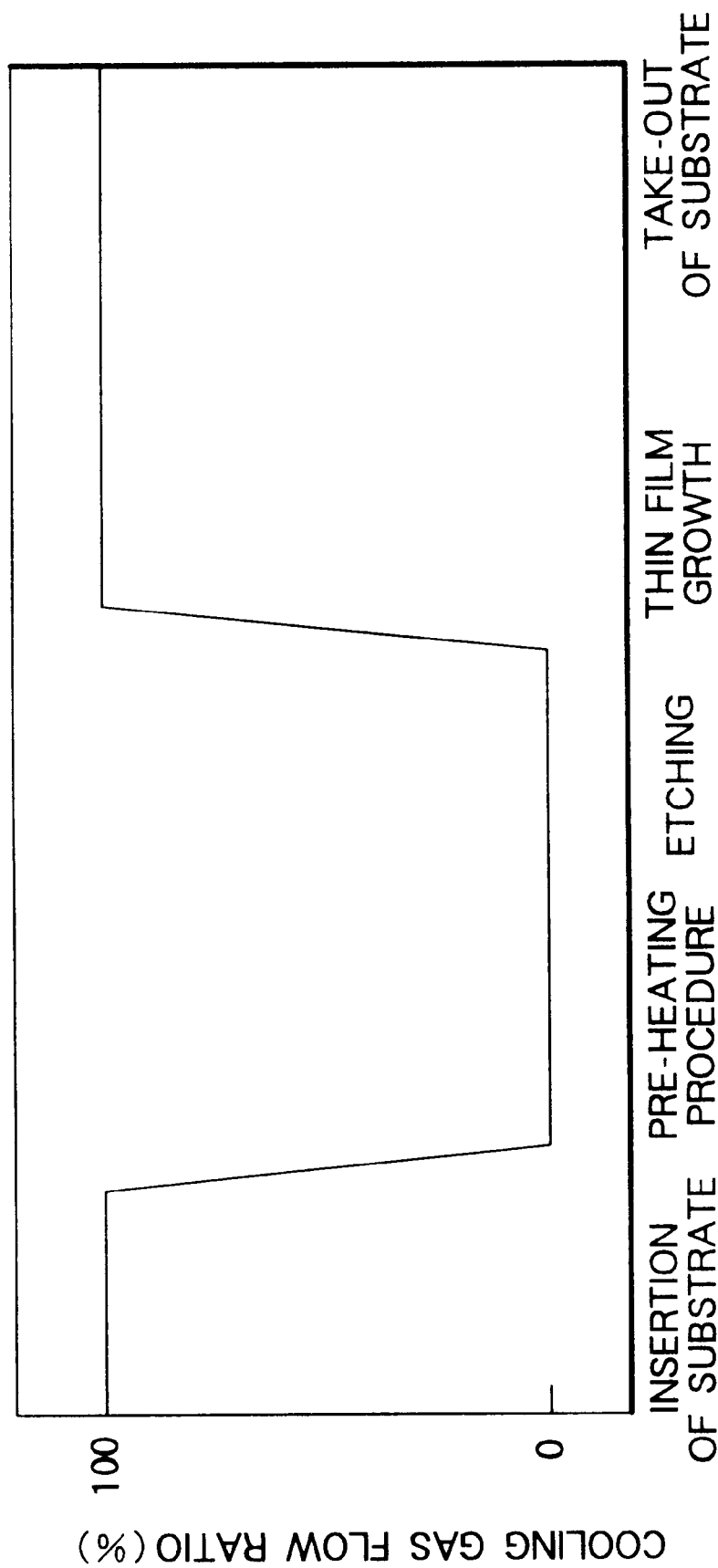

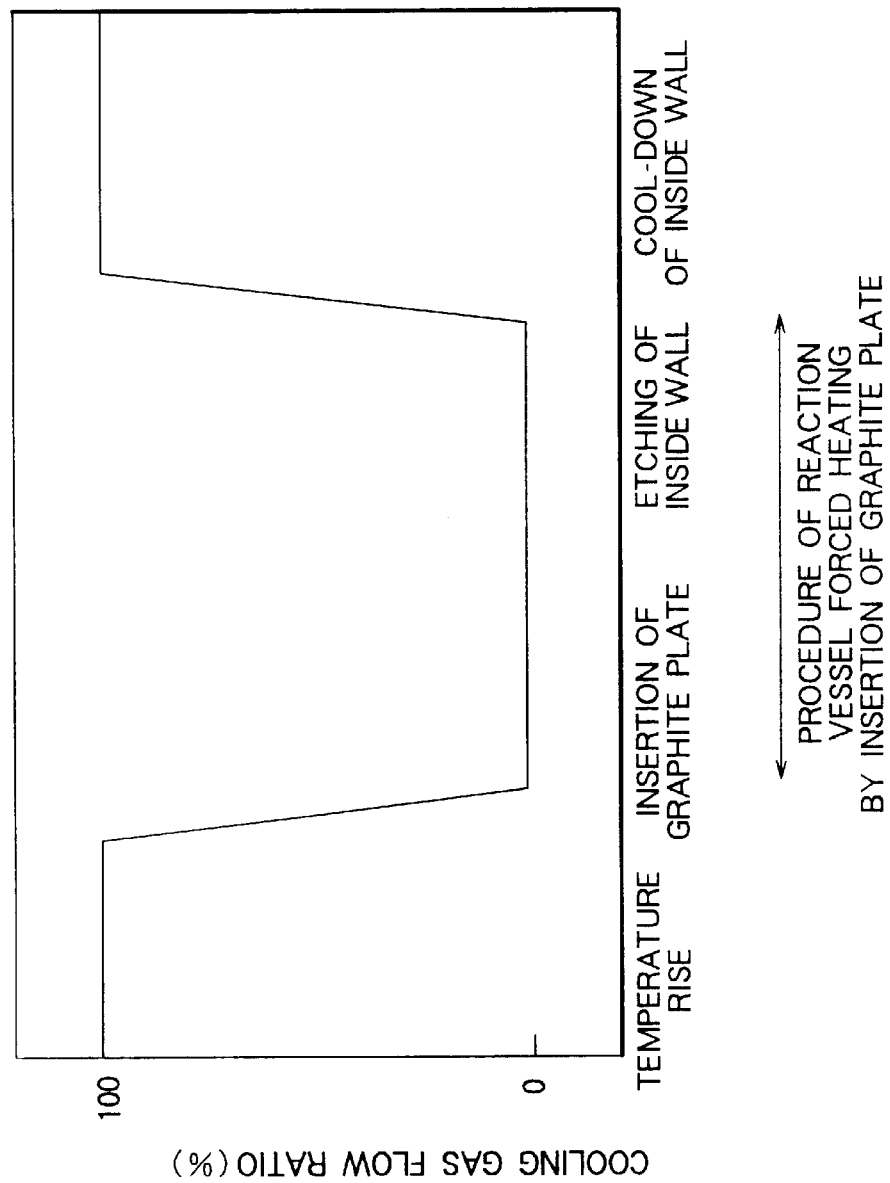

METHOD AND APPARATUS FOR THIN FILM GROWTH

BACKGROUND OF THE INVENTION

1. Field of the Invention

This invention relates to a method and an apparatus for a thin film growth of silicon and the like on a semiconductor crystal substrate of silicon and the like.

2. Description of the Prior Art

In a reaction vessel 3 of a conventional thin film growth apparatus shown in FIG. 6 (FIG. 6 is a schematic cross-section of the apparatus.), in the case of growth of the thin film 9 on the semiconductor crystal substrate by introducing a raw material gas 5 of silicon or organic metal gas in a gas phase, a material consisting of the same constituent like the thin film 9 will be deposited on the inside wall surface 3a of the reaction vessel 3 which is kept at high temperature. A protruding surface defect and a stacking fault may be formed on the thin film 9 by adhering the material which is exfoliated from the wall and transferred on the substrate 1 during the film growth.

To prevent a deposition of the material on the inside wall surface a so-called "cold wall" type reaction vessel in which a temperature of the wall of the reaction vessel 3 is kept much lower than that of the substrate 1 has been employed, therefore, the temperature of the wall of the reaction vessel 3 is controlled at low temperature throughout thin film growth. An embodiment of effective cooling technology of the reaction vessel 3 is described in JP-A-57-2527, and JP-A-60-110116.

In FIG. 6, 2, 4, 6a and 11 denote as a susceptor, an infrared heater, a cooling gas for the inside wall 3a of the reaction vessel 3, and an exhaust, respectively.

As a preliminary procedure before thin film growth in gas phase, usually, there is an etching procedure so as to remove a natural oxide film on the surface of the substrate 1 by maintaining the temperature of the substrate 1 in a certain temperature in hydrogen atmosphere as a pre-heat treatment or by introducing HCl gas. In this case, impurities which are evaporated from the substrate 1 by an external diffusion or etching are to be adsorbed on the inside wall 3a of the reaction vessel 3, whenever the temperature of inside wall 3a of the reaction vessel 3 is kept at low temperature. The impurities adsorbed once on the inside wall 3a will be gradually dissolved, then transferred by gas flow to the growing surface of the substrate 1 and mixed with the thin film 9. As is explained above, during gas phase growth procedure, the impurities evaporated from the substrate 1 will be delivered gradually from the inside wall 3a and mixed with the thin film 9, that is a so-called autodoping phenomenon. According to this autodoping, there is a problem, in which an interface resistivity between the substrate 1 and thin film 9 will change widely, so a transient width TB becomes large, showing in the impurity distribution (refer to the profile B of a spreading resistance) in the conventional method given in FIG. 5.

When a plurality of thin film growth procedures are continuously conducted by a batch method, without introducing the etching procedure in which the material deposited on the inside wall 3a of the reaction vessel 3 is removed by flowing large quantity of HCl gas, the dopant will be kept in an adhered condition in the inside wall 3a, therefore, the resistivity of thin film thus formed on the substrate 1 will be decreased gradually batch after batch, even though a constant quantity of a dopant is supplied to the reaction vessel 3. Especially, just after a washed reaction vessel 3 is introduced, an influence of what is called a memory effect is very remarkable.

Furthermore, minority carrier life time is decreased once contaminants like a heavy metals are adsorbed on the inside wall 3a of the reaction vessel 3, and in the case of "cold wall" type, it takes long time for the recovery of the lifetime because the contaminants will be delivered gradually during the gas phase growth.

SUMMARY OF THE INVENTION

The aim of this invention is to supply a method and an apparatus for the thin film growth, wherein a quantity of the impurities and contaminants to be adsorbed on the inside wall of the reaction vessel can be restrained, moreover the impurities and contaminants adsorbed on the inside wall can be removed easily.

The first aspect of this invention resides in the following method. That is to say, a method for a thin film growth on a semiconductor crystal substrate, in the step of the semiconductor crystal substrate being mounted in a reaction vessel, the semiconductor crystal substrate being heated while the wall of the reaction vessel is cooled forcibly by a coolant, then the thin film being grown on the substrate by supplying a raw material gas into the reaction vessel, characterised by the fact that a temperature of the wall of the reaction vessel during the procedure except the thin film growth is kept higher temperature than the temperature of the wall of said reaction vessel during the thin film growth procedure.

The second aspect of this invention resides in a method, wherein a procedure in which the temperature of the wall of the reaction vessel is kept higher than the temperature of the wall of the reaction vessel during the thin film growth procedure is the procedure of a pre-heat treatment and/or an etching procedure of the substrate.

Furthermore, the third aspect of this invention resides in a method, wherein a procedure in which the temperature of the wall of the reaction vessel is kept higher than the temperature of the wall of the reaction vessel during the thin film growth procedure is an etching procedure of a deposited matertial on the inside wall of the reaction vessel.

On the other hand, the fourth aspect of this invention resides in the following apparatus. This is to say, an apparatus for a thin film growth on a semiconductor crystal substrate comprising a susceptor for loading a semiconductor crystal substrate in a reaction vessel, and a wall of the reaction vessel being cooled forcibly by the coolant, while the substrate is under heating procedure to grow the thin film on the substrate by supplying a raw material gas into the reaction vessel, characterised by that a coolant supply device to control the flow rate of the coolant for cooling the wall of said reaction vessel is installed.

Furthermore, the fifth aspect of this invention resides in an apparatus mentioned below. Namely, an apparatus for a thin film growth on a semiconductor crystal substrate comprising a susceptor for loading a semiconductor crystal substrate in a reaction vessel, and a wall of the reaction vessel being cooled forcibly by the coolant, while the substrate is under heating procedure to grow the thin film on the substrate by supplying a raw material gas into the reaction vessel, characterised by the fact that a heating device to heat forcibly the reaction vessel in the procedure except during the procedure of the thin film growth is installed.

The sixth aspect of this invention resides in an apparatus, wherein the heating device comprises a heating source and highly thermal absorptive material inserted between the wall of the reaction vessel and the heating source, thereby heat can be transferred from the highly thermal absorptive material to the wall of the reaction vessel.

Carbon is selected as an example of the highly thermal absorptive material.

The characteristics of the thin film growth method according to this invention is to maintain the wall of the reaction vessel as a so-called "hot wall" at the procedure except thin film growth procrdure by maintaining higher wall temperature than the temperature at the thin film growth procedure.

Whenever the temperature of the wall of the reaction vessel is kept at high temperature level, impurities and contaminants are hardly adsorbed on the wall of the reaction vessel, for example, during the pre-heat treatment procedure in which the substrate is heated by flowing hydrogen gas, or during the etching procedure of the substrate surface, or during etching procedure of the deposited material on the inside wall of the reaction vessel, and these impurities and contaminants can be removed in short time and also cannot stay on the wall, therefore, such phenomena as autodoping, memory effect and decrease of minority carrier life time will be diminished.

In order to raise the temperature of the wall of the reaction vessel compared with the temperature of the wall of the reaction vessel during the thin film growth procedure, as shown in FIG. 1, for example, a flow rate of a coolant 6 (air, nitrogen, water, etc.) which is used for the forcible cooling of the wall of the reaction vessel 3 has to be decreased. If the supply of the coolant 6 is stopped, the temperature of the wall of the reaction vessel will increase several hundred degrees. That is, the temperature of the wall of the reaction vessel can be controlled by controlling the flow control of the coolant 6 within a range of several hundred degrees, using a rotation speed variable type pump 8 to supply the coolant 6 or using a valve opening degree control valve 7 in a piping system to supply the coolant 6.

On the other hand, in order to heat the temperature of the wall of the reaction vessel into over several hundred degrees, for example, a material having a high thermal absorptivity like carbon has to be inserted between the reaction vessel 3 and heating source, then heat is transferred from the material having high thermal absorptivity to the reaction vessel. The reaction vessel 3 can be heated forcibly by the above material.

BRIEF DESCRIPTION OF THE DRAWINGS

The invention will be better understood and the objects and features thereof other than those set forth above will become apparent when consideration is given to the following detailed description thereof, which makes reference to the annexed drawings wherein:

FIG. 1 is a drawing showing the first embodiment of a thin film growth apparatus of this invention.

FIG. 2 is a drawing showing cooling gas flow ratio 6a vs. procedure in the first embodiment.

FIG. 4 is a drawing showing cooling gas flow ratio 6a vs. procedure in the second embodiment.

DETAILED DESCRIPTION OF THE PREFERRED EMBODIMENT

Figure 3A:
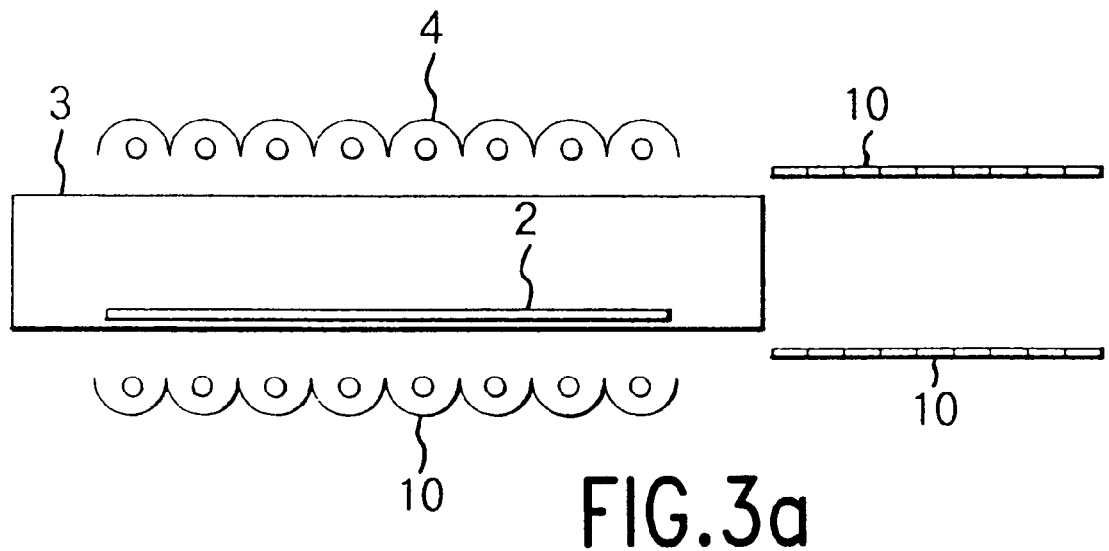
FIGS. 3(a) and 3(b) are drawings showing the second embodiment of a thin film apparatus of this invention.

The first embodiment of this invention in which the temperature of the reaction vessel 3 is raised by decreasing the flow rate of the coolant 6 as shown in FIGS. 1 and 2 is described.

As a reaction vessel 3, a quartz glass vessel of a rectangle cross-section with 20 mm in hight and 300 mm in width is used. A susceptor 2 supporting a substrate 1 is mounted in the reaction vessel 3. A set of infrared type heater 4 is mounted outside the reaction vessel 3 in order to maintain the substrate 1 at a specified temperature. A part of the reaction vessel 3 facing the infrared heater 4 has a transparent structure through which infrared radiation light of the infrared heater 4 penetrates.

Air as a coolant gas 6a which can be adjusted its flow rate flows through a space formed between the reaction vessel 3 and infrared heater 4. For the adjustment of this coolant gas 6a, a pump which can change its flow rate by changing an applied voltage or current, or a control valve 7 in its piping system is installed. Both of them also can be used simultaneously.

As is shown in FIG. 2, a cooling gas flow ratio will be extremly decreased at the pre-heat treatment procedure and etching procedure of the substrate 1. On the other hand, the cooling gas flow ratio will be increased at the procedure of the insertion of the substrate 1 in the reaction vessel 3 and the procedure from the thin film growth to unloading of the substrate out of the reaction vessel 3. Here, the cooling gas flow ratio is defined as a ratio of flow rate of the cooling gas 6a to the maximum flow rate of the cooling gas piping system. The flow rate of the cooling gas 6a is adjusted by a rotation ratio of an air-pump 8 and/or a degree of opening of the control valve 7. The flow rate of the cooling gas 6a at 100% cooling gas flow ratio amounted to 20 $m^3$/min.

In the case of the measurement of the temperature change of the wall of the reaction vessel by adjusting the cooling gas flow ratio of the cooling gas 6a, it is impossible to measure the temperature of a transparent quartz glass by a radiation thermometer. It is also very difficult to measure it using a thermocouple because a temperature sensing part of the thermocouple will be locally heated by irradiation of infrared light. Accodingly, the temperature measurements are carried out by inserting quickly a very fine wire thermocouple into the reaction vessel while infrared heater 4 is extinguished. Real temperature of the wall of the reaction vessel can not be measured by this method, but the temperature of the wall of the reaction vessel can be estimated.

After the temperature inside the vessel 3 became below 800° C., a substrate 1 was inserted into the reaction vessel 3 and loaded on the susceptor 2. At this time, the temperature of the wall of the reaction vessel 3 was about 300° C. As the substrate 1, a silicon single crystal substrate doped with boron, having 200 mm in its diameter, resistivity of 0.015 $\Omega \cdot cm$, and crystal orientation of (100) was used. After completion of the insertion of the substrate 1, the cooling gas flow ratio of the cooling gas 6a was set to zero % so as to raise the temperature of the reaction vessel 3 as high as possible, hydrogen gas as a carrier gas of 100 liters/min was introduced and the infrared heater was on.

After the temperature of the substrate 1 reached to 1100° C., pre-heat treatment was carried out by keeping its temperature for five minutes, then the surface of the substrate 1 was etched by flowing gas with mixing HCl gas of 1 liter/min. The temperature of the wall of the reaction vessel 3 was about 800° C. by the temperature measurement method described above.

In these pre-heat treatment and etching procedures, a silicon dioxide thin film (its thickness about 1.5 nm) formed on the surface of the silicon substrate 1 surface will be exfoliated by the reaction with hydrogen gas or HCl gas, thereafter transferred by a carrier gas. On the other hand, boron doped in the substrate 1 is also vaporized from the surface of the substrate 1 and diffused into the gas phase by the external diffusion and etching.

In a conventional procedure, if the temperature of the reaction vessel 3 is kept at low temperature, impurities, silicon monoxide, silicon dioxide, and metallic contaminants which are delivered into gas phase from the substrate during the pre-heat treatment and etching procedure will form an equilibrium condition due to the temperature at the inside wall 3a, and therefore, majority of these impurities will remain on the inside wall 3a until the succeeding procedure of the thin film growth, then gradually, these impurities and contaminants will be continuously delivered, accordingly, it may widen a transient width and also decrease a minority carrier lifetime.

On the other hand, in the experiment based on an apparatus of this invention, it was confirmed that the temperature of the wall of the reaction vessel 3 which was not forcibly cooled at the pre-heat treatment was about 800° C., therefore, it was assumed that the impurities and contaminants delivered to the gas phase during the pre-heat treatment and etching procedure of the substrate 1 were hardly adsorbed on the inside wall 3a, but exhausted to outside with the carrier gas.

After the etching procedure was finished, the wall of the reaction vessel 3 was cooled preliminarily for two minutes by adjusting the cooling gas flow ratio of cooling air to 100%, trichlorosilane as a raw material gas of 10 g/min and diborane gas as a dopant were mixed together into hydrogen gas. Accordingly, trichlorosilane introduced into the reaction vessel 3 reacted on the surface of the substrate 1 which was heated at 1100° C., then a thin film 9 was formed thereon, the growth rate was about 3 $\mu$m/min. After one minute of the growth, supply of trichlorosilane and diborane was stopped. Thereafter, cool-down of the inside of the reaction vessel 3 was conducted by turn-off of the infrared heater 4, the substrate 1 with the semiconductor crystal thin film 9 was taken out from the reaction vessel 3, by maintaining 100% of the cooling gas flow ratio of the cooling gas 6a.

Figure 5:
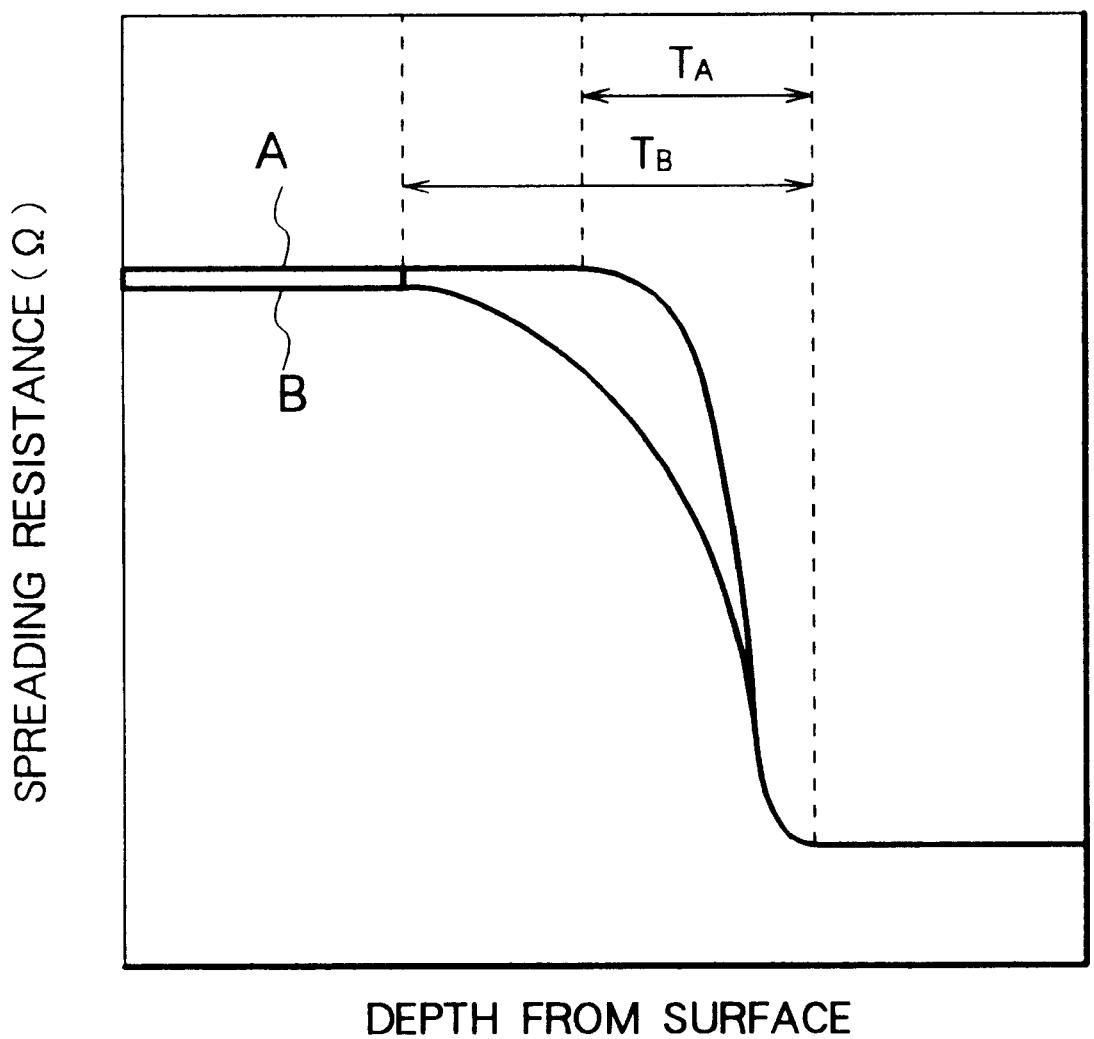
FIG. 5 is a graph showing a distribution of spreading resistance obtained from the apparatus in FIG. 1 and a conventional apparatus.
Figure 6:
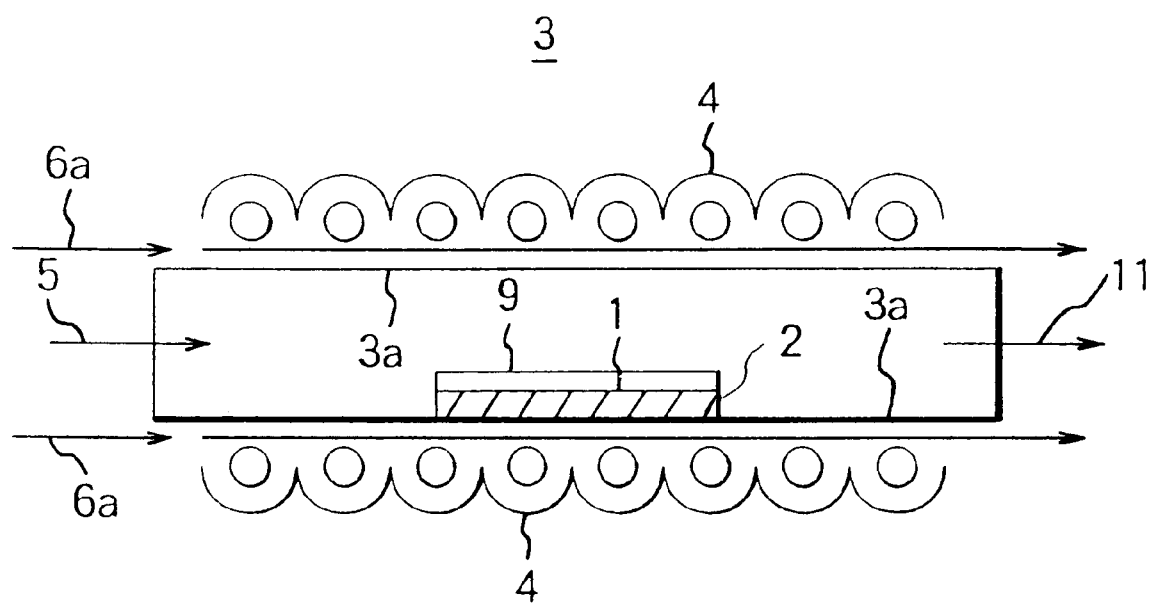
FIG. 6 is a drawing showing a prior art thin film growth apparatus.

The transient width TA of the thin film 9 formed by the procedure and condition described above was compared with the transient width TB of a thin film 9 formed by the conventional condition. As shown in FIG. 5, the transient width TA of the thin film 9 formed by the method of this invention became narrower than the transient width TB formed by the conventional method, and the influence of autodoping phenomenon was drastically improved in the method of this invention.

The profile A of the spreading resistance in this invention is steeper than the profile B in the conventional method and the spreading resistance of the profile A itself has a higher resistance value than profile B, therefore, it is clear that the influence of the memory effect was improved by this invention.

Next, second embodiment of this invention is described. In an etching procedure of the deposited material on the inside wall surface 3a of the reaction vessel 3, the temperature of the reaction vessel 3 was kept higher temperature by forcible heating than during the procedure of thin film growth. This embodiment is explained by using FIGS. 3 and 4.

Figure 3B:
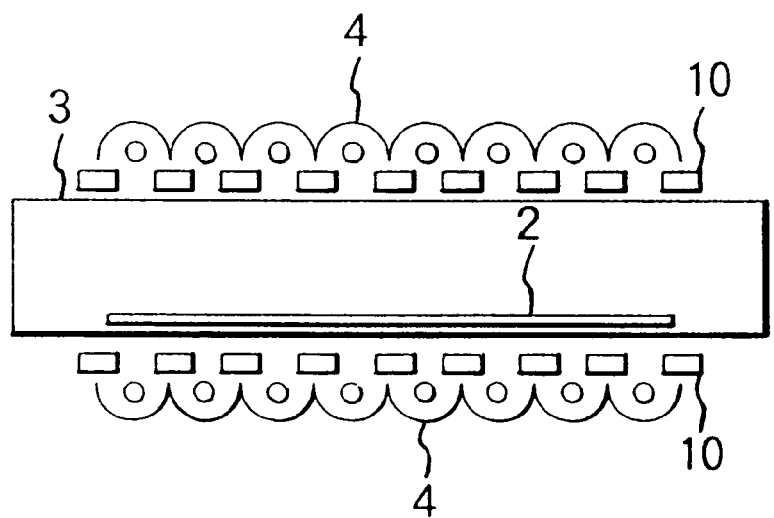

As the reaction vessel 3, the same reaction vessel as that used in the first embodiment was employed. A set of graphite plates by which the reaction vessel 3 is forcibly heated was used. In the etching procedure of the deposited material on the inside surface 3a in the reaction vessel 3, hydrogen gas of 100 liters/min was introduced in the reaction vessel 3, then the temperature in the reaction vessel 3 was raised to 1150° C. by the infrared heater 4. Soon after the temperature was rised to 1150° C., a set of graphite plates 10 which was stored in a compressed state at the exhaust side of the reaction vessel 3 as shown in FIG. 3(a) was inserted into the space between the reaction vessel 3 and infrared heater 4 in the stretched state as shown in FIG. 3(b). Thus the set of graphite plates absorbed a thermal energy from the infrared heater 4, and transmitted the energy to the wall of the reaction vessel 3, thereby the wall of the reaction vessel was forcibly heated. During this forced heating, the supply of the cooling gas 6a was stopped. The change of the cooling gas flow ratio of the cooling gas 6a in the second embodiment is shown in FIG. 4 for each procedure in this second embodiment.

Three minutes after the temperature was raised to 1150° C., etching of the inside wall 3a was started by introducing hydrogen gas mixed with HCl gas of 10 liters/min. After flowing of HCl gas for five minutes, HCl gas flow was stopped, thereby only hydrogen gas was flown for another three minutes. Then the infrared heater 4 was turned off. The set of graphite plates 10 was returned to the exhaust side, at the same time as the infrared heater was turned off. And cooling gas flow ratio was raised from 0% to 100%. After the temperature of the inside of the reaction vessel 3 was dropped to 800° C., the substrate 1 was introduced into the rection vessel 3 for the next gas phase growth procedure.

The etching procedure of the deposited material on the inside wall surface 3a of the reaction vessel 3 was performed by the following two methods, one method was for the second embodiment and the other method was for the conventional method. Just after etching procedure by each method, the gas phase growth procedure was performed to compare a generation lifetime of the thin film 9 for each method. The substrate 1 used for this comparison was a silicon single crystal substrate consisting of p-type, its resistivity of 10 $\Omega$·cm, its lattice plane orientation of (100), its diameter of 8 inches, and grown by Czochralsky method, and a 3 $\mu$m thickness of a single crystal thin film was grown on the substrate 1 by an non-doping condition.

The generation lifetime was 1000 $\mu$sec after the gas phase growth by the second embodiment of this invention, on the other hand, the generation life time was 300 $\mu$sec after the gas phase growth by the conventional method.

As is described above, the quantity of impurities and contaminants adsorbed on the inside wall of the reaction vessel can be decreased by the method and apparatus for the thin film growth of this invention, and moreover, the impurities and contaminants on the inside wall can be effectively and quickly removed to the non-affected level.

What is claimed is:

1. A method for growing a thin film on a semiconductor single crystal substrate doped with impurities in a cold-wall-type reaction vessel comprising the steps of:

mounting said semiconductor single crystal substrate in said reaction vessel;

pre-heating in hydrogen atmosphere or gas phase etching said semiconductor single crystal substrate; and growing a thin film on said semiconductor single crystal substrate by supplying raw material gas into said reaction vessel while a wall of said reaction vessel is forcibly cooled by a coolant;

wherein the temperature of the wall of said reaction vessel during either the pre-heating or the etching of said semiconductor single crystal substrate is maintained higher than a temperature of the wall during said thin film growth enough to diminish memory effect.

2. A method for growing a thin film according to claim 1, wherein the temperature of the wall of said reaction vessel during either said preheating step or said etching step is maintained higher than the temperature of the wall during said thin film growth by reducing the amount of the coolant used to forcibly cool the wall of said reaction vessel.

3. A method according to claim 2 wherein said semiconductor single crystal substrate is a silicon single crystal and said thin film is a silicon semiconductor thin film and wherein said etching step is conducted by introducing hydrogen chloride gas.

4. A method for growing a thin film according to claim 1, wherein the temperature of the wall of said reaction vessel during either said preheating step or said etching step is maintained higher than the temperature of the wall during said thin film growth by stopping supply of the coolant used to forcibly cool the wall of said reaction vessel.

5. A method according to claim 4 wherein said semiconductor single crystal substrate is a silicon single crystal and said thin film is a silicon semiconductor thin film and wherein said etching step is conducted by introducing hydrogen chloride gas.

6. A method according to claim 1 wherein said semiconductor single crystal substrate is a silicon single crystal and said thin film is a silicon semiconductor thin film and wherein said etching step is conducted by introducing hydrogen chloride gas.

7. A method for growing a thin film on a semiconductor single crystal substrate doped with impurities in a cold-wall-type reaction vessel comprising the steps of:

mounting said semiconductor single crystal substrate in said reaction vessel;

pre-heating in hydrogen atmosphere or gas phase etching said semiconductor single crystal substrate; and growing a thin film on said semiconductor single crystal substrate by supplying raw material gas into said reaction vessel while a wall of said reaction vessel is forcibly cooled by a coolant;

wherein the temperature of the wall of said reaction vessel during either the pre-heating or the etching of said semiconductor single crystal substrate is maintained higher than the temperature of the wall during said thin film growth and said temperature of the wall of said reaction vessel during the pre-heating or the etching being high enough to diminish decrease of a minority carrier lifetime.

8. A method for growing a thin film according to claim 7, wherein the temperature of the wall of said reaction vessel during said pre-heating step or said etching step is maintained higher than the temperature of the wall during said thin film growth by reducing the amount of the coolant used to forcibly cool the wall of said reaction vessel.

9. A method according to claim 8 wherein said semiconductor single crystal substrate is a silicon single crystal and said thin film is a silicon semiconductor thin film and wherein said etching step is conducted by introducing hydrogen chloride gas.

10. A method for growing a thin film according to claim 7, wherein the temperature of the wall temperature of said reaction vessel during either said pre-heating step or said etching step is maintained higher than the temperature of the wall during said thin film growth by stopping supply of the coolant used to forcibly cool the wall of said reaction vessel.

11. A method according to claim 10 wherein said semiconductor single crystal substrate is a silicon single crystal and said thin film is a silicon semiconductor thin film and wherein said etching step is conducted by introducing hydrogen chloride gas.

12. A method according to claim 7 wherein said semiconductor single crystal substrate is a silicon single crystal and said thin film is a silicon semiconductor thin film and wherein said etching step is conducted by introducing hydrogen chloride gas.

13. A method for etching materials deposited on a wall of a cold-wall-type reaction vessel, comprising the steps of:

conducting a plurality of thin film growth procedures for growing a thin film on a semiconductor single crystal substrate while the wall of said reaction vessel forcibly cooled by a coolant;

conducting an etching procedure for etching materials deposited upon the wall of said reaction vessel;

wherein the temperature of the wall of said reaction vessel during etching the materials on said wall is maintained higher than a temperature of the wall during said thin film growth and said temperature of the wall of said reaction vessel during said etching being high enough to diminish memory effect.

14. A method for etching materials deposited on a wall of a reaction vessel according to claim 13, wherein the temperature of the wall of said reaction vessel during etching the materials on the wall is maintained higher than the temperature of said wall during thin film growth by reducing the amount of the coolant used to forcibly cool the wall of said reaction vessel.

15. A method according to claim 14 wherein said semiconductor single crystal substrate is a silicon single crystal and said thin film is a silicon semiconductor thin film and wherein said etching step is conducted by introducing hydrogen chloride gas.

16. A method for etching materials deposited on a wall of a reaction vessel according to claim 13, wherein the temperature of the wall of said reaction vessel is maintained higher than the temperature of the wall during said thin film growth by stopping supply of the coolant used to forcibly cool the wall of said reaction vessel.

17. A method according to claim 16 wherein said semiconductor single crystal substrate is a silicon single crystal and said thin film is a silicon semiconductor thin film and wherein said etching step is conducted by introducing hydrogen chloride gas.

18. A method according to claim 13 wherein said semiconductor single crystal substrate is a silicon single crystal and said thin film is a silicon semiconductor thin film and wherein said etching step is conducted by introducing hydrogen chloride gas.

* * * * *